(12) United States Patent
Chin-Cheng

(10) Patent No.: US 8,223,110 B2
(45) Date of Patent: Jul. 17, 2012

(54) DISPLAYS

(75) Inventor: Tsai Chin-Cheng, Kaohsiung (TW)

(73) Assignee: Chimei Innolux Corporation, Miao-Li County (TW)

( * ) Notice: Subject to any disclaimer, the term of this patent is extended or adjusted under 35 U.S.C. 154(b) by 562 days.

(21) Appl. No.: 12/463,510

(22) Filed: May 11, 2009

(65) Prior Publication Data

US 2009/0278785 A1 Nov. 12, 2009

(30) Foreign Application Priority Data

May 12, 2008 (TW) .................................. 97117485 A

(51) Int. Cl.
*G09G 3/36* (2006.01)
(52) U.S. Cl. ........................................ 345/100; 377/64
(58) Field of Classification Search ............ 345/98–100; 377/64–81
See application file for complete search history.

(56) References Cited

U.S. PATENT DOCUMENTS

| | | | | |
|---|---|---|---|---|
| 4,679,214 A * | 7/1987 | Takemae | ........................ | 377/80 |
| 5,517,542 A * | 5/1996 | Huq | .................................. | 377/78 |
| 5,701,136 A * | 12/1997 | Huq et al. | ...................... | 345/100 |
| 5,949,398 A * | 9/1999 | Kim | ................................ | 345/100 |
| 7,342,568 B2 * | 3/2008 | Wei et al. | ....................... | 345/100 |
| 2004/0046729 A1 | 3/2004 | Moon | | |
| 2005/0008114 A1 | 1/2005 | Moon | | |
| 2005/0264514 A1 | 12/2005 | Kim et al. | | |
| 2007/0297559 A1 * | 12/2007 | Cho et al. | ......................... | 377/64 |
| 2008/0012816 A1 * | 1/2008 | Moon | ......................... | 345/100 |
| 2008/0056430 A1 * | 3/2008 | Chang et al. | ..................... | 377/64 |
| 2008/0062097 A1 * | 3/2008 | Jeong et al. | ...................... | 345/84 |

* cited by examiner

*Primary Examiner* — Alexander Eisen
*Assistant Examiner* — Sanjiv D Patel
(74) *Attorney, Agent, or Firm* — Thomas|Kayden

(57) ABSTRACT

A display includes a glass substrate, a source driver and a gate driver. The glass substrate includes multiple pixels. The source driver is used to drives the pixels, and the gate driver disposed on the glass substrate enables the pixels. The gate driver has (N+1) shift registers. The $n^{th}$ shift register includes an input unit, an output unit, an output pull-down unit and a threshold voltage memory unit. When an output signal of the $(n+1)^{th}$ shift register is at a high voltage level, the threshold voltage memory unit turns on the output pull-down unit such that an output signal of the $n^{th}$ shift register is changed to and maintained at a low voltage level. The threshold voltage memory unit stores a characteristic voltage relating to a threshold voltage of the output pull-down unit.

16 Claims, 12 Drawing Sheets

Vto=1

Vto=10

US 8,223,110 B2

DISPLAYS

This application claims priority to Taiwan application serial no. 97117485, filed May 12, 2008, the entire content of which is incorporated herein by reference.

BACKGROUND

This document relates in general to displays.

In some examples, a thin film transistor liquid crystal display (TFT-LCD) has a backlight module and a liquid crystal layer positioned between two glass substrates. In an active matrix liquid crystal display, transistors are fabricated on a glass substrate using semiconductor manufacturing processes. An amorphous silicon gate driver can be used to select a row of pixels into which data are written.

The amorphous silicon gate driver can have multiple shift registers. FIG. 1 is a circuit diagram of an example shift register 100, which includes a first transistor M1, a second transistor M2, a third transistor M3, a fourth transistor M4, and a capacitor C. In this example, the transistors M1, M2, M3, and M4 are N-type MOSFETs. When an $(n-1)^{th}$ output signal $OUT_{n-1}$ is at a high voltage level, the first transistor M1 is turned on to cause the third transistor M3 to be turned on, which causes the $n^{th}$ output signal $OUT_n$ to be at a high voltage level. The capacitor C pulls the voltage level at node P to be higher than the high voltage level to keep the third transistor M3 turned on.

When the $(n+1)^{th}$ output signal $OUT_{n+1}$ is at the high voltage level, the second transistor M2 and the fourth transistor M4 are turned on, the voltage level at node P changes to a low voltage level VSS, and the $n^{th}$ output signal $OUT_n$ becomes equal to the low voltage level VSS. The third transistor M3 and the fourth transistor M4 are turned off for most of the frame period, so the voltage level of node O is floating for most of the frame period. Consequently, the voltage level of node O may be influenced by the voltage coupling to the data line so that the shift register 100 outputs the incorrect $n^{th}$ output signal $OUT_n$ to enable the thin film transistor to operate in an active region, such that the TFT-LCD displays an incorrect image frame.

FIG. 2 is a circuit diagram showing an example shift register 200, which includes seven N-type transistors M1 to M7, and a capacitor C. When the $(n+1)^{th}$ output signal OUTn+1 is at the high voltage level, the second transistor M2 is turned on such that the voltage level at node Q is at the low voltage level VSS, and the voltage level of node QB is at the high voltage level. The third transistor M3 is turned on to keep the voltage level at node Q at the low voltage level VSS, and the seventh transistor M7 is turned on to keep the voltage level at node O at the low voltage level VSS. As a result, the shift register 200 can output the correct $n^{th}$ output signal $OUT_n$.

The third transistor M3 and the seventh transistor M7 are turned on for a long period of time, and are not turned off until the shift register 200 is triggered by the previous stage of the shift register to output the $n^{th}$ output signal $OUT_n$. Because the third transistor M3 and the seventh transistor M7 are turned on for the long period of time, the threshold voltages of the third transistor M3 and the seventh transistor M7 may shift.

FIG. 3 shows current-voltage curves of a transistor that is turned on for about 6000 seconds. After being turned on for a long period of time, the third transistor M3 and the seventh transistor M7 have large threshold voltage shifts and may cause the shift register 200 to operate improperly.

SUMMARY

A display uses a threshold voltage memory unit for storing a characteristic voltage relating to a threshold voltage of a transistor so that a shift register can operate properly.

In general, in one aspect, a display includes a glass substrate, a source driver, and a gate driver. The glass substrate includes multiple pixels. The source driver drives the pixels, and the gate driver formed on the glass substrate enables the pixels. The gate driver has (N+1) shift registers, wherein N is a positive integer. The $n^{th}$ shift register includes an input unit, an output unit, an output pull-down unit, and a threshold voltage memory unit, in which n is a positive integer ranging from 1 to (N+1). The input unit receives an output signal of the $(n-1)^{th}$ shift register of the gate driver. The output unit coupled to the input unit receives an $M^{th}$ clock signal and outputs an output signal of the $n^{th}$ shift register of the gate driver, in which M is equal to 1 when n is an odd number, and M is equal to 2 when n is an even number. The output pull-down unit is coupled to the output unit and receives a low operation voltage. The threshold voltage memory unit coupled to the output pull-down unit receives the low operation voltage and an output signal of the $(n+1)^{th}$ shift register of the gate driver. When the output signal of the $(n+1)^{th}$ shift register is at a high voltage level, the threshold voltage memory unit turns on the output pull-down unit such that the output signal of the $n^{th}$ shift register changes to a low voltage level, and the threshold voltage memory unit stores a characteristic voltage relating to a threshold voltage of the output pull-down unit.

In general, in another aspect, a display includes a glass substrate, a source driver, and a gate driver. The glass substrate includes multiple pixels. The source driver drives the pixels, and the gate driver disposed on the glass substrate enables the pixels. The gate driver has (N+1) shift registers, in which N is a positive integer. The $n^{th}$ shift register includes an input unit, an output unit, an output pull-down unit, and a threshold voltage memory unit, in which n is a positive integer ranging from 1 to (N+1). The input unit receives an output signal of the $(n-1)^{th}$ shift register of the gate driver. The output unit coupled to the input unit receives an $M^{th}$ clock signal, and outputs an output signal of the $n^{th}$ shift register, in which M is equal to 1 when n is an odd number, and M is equal to 2 when n is an even number. The output pull-down unit coupled to the output unit receives a low operation voltage. The threshold voltage memory unit coupled to the input unit and the output pull-down unit receives the low operation voltage, an output signal of the $(n+1)^{th}$ shift register of the gate driver, and an output signal of the $(n+2)^{th}$ shift register of the gate driver. When the output signal of the $(n+1)^{th}$ shift register is at a high voltage level, the threshold voltage memory unit turns on the output pull-down unit such that the output signal of the $n^{th}$ shift register changes to a low voltage level. When the output signal of the $(n+2)^{th}$ shift register is at the high voltage level, the threshold voltage memory unit stores a characteristic voltage relating to a threshold voltage of the output pull-down unit.

In general, in another aspect, a display includes a glass substrate, a source driver, and a gate driver. The glass substrate includes multiple pixels. The source driver drives the pixels, and the gate driver disposed on the glass substrate enables the pixels. The gate driver has (N+1) shift registers, in which N is a positive integer. The $n^{th}$ shift register includes an input unit, an output unit, a first output pull-down unit, a second output pull-down unit, a first threshold voltage memory unit, and a second threshold voltage memory unit, in which n is a positive integer ranging from 1 to (N+1). The input unit receives an output signal of the $(n-1)^{th}$ shift register of the gate driver. The output unit coupled to the input unit receives an $M^{th}$ clock signal and outputs an output signal of the $n^{th}$ shift register, in which M is equal to 1 when n is an odd number, and M is equal to 2 when n is an even number. The first output pull-down unit is coupled to the output unit and receives a low operation voltage. The second output pull-down unit coupled to the output unit receives the low operation voltage. The first threshold voltage memory unit coupled to the input unit and the first output pull-down unit receives a first operation voltage, the low operation voltage, an output signal of the $(n+1)^{th}$ shift register of the gate driver, and an output signal of the $(n+2)^{th}$ shift register of the gate driver. The second threshold voltage memory unit coupled to the input unit and the second output pull-down unit receives a second operation voltage, the low operation voltage, the output signal of the $(n+1)^{th}$ shift register, and the output signal of the $(n+2)^{th}$ shift register. When the output signal of the $(n+1)^{th}$ shift register is at a high voltage level, the first operation voltage is at the high voltage level, the second operation voltage is at a low voltage level, and the first threshold voltage memory unit turns on the second transistor and the fourth transistor such that the output signal of the $n^{th}$ shift register changes to the low voltage level in an even-numbered frame period; and the first operation voltage is at the low voltage level, the second operation voltage is at the high voltage level, and the second threshold voltage memory unit turns on the fifth transistor and the sixth transistor such that the output signal of the $n^{th}$ shift register changes to the low voltage level in an odd-numbered frame period. When the output signal of the $(n+2)^{th}$ shift register is at the high voltage level, the first threshold voltage memory unit stores a first characteristic voltage relating to a threshold voltage of the first output pull-down unit in the even-numbered frame period; and the second threshold voltage memory unit stores a second characteristic voltage relating to a threshold voltage of the second output pull-down unit in the odd-numbered frame period.

DETAILED DESCRIPTION

A display uses a threshold voltage memory unit for storing a characteristic voltage relating to a threshold voltage of a transistor such that the transistor of the shift register can operate properly.

Figure 1:
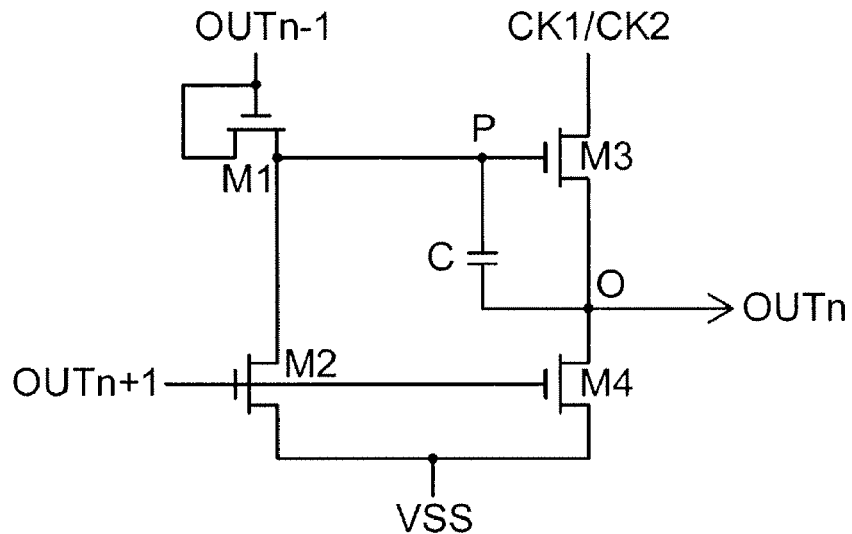
FIGS. 1 and 2 are circuit diagrams of example shift registers.
Figure 2:
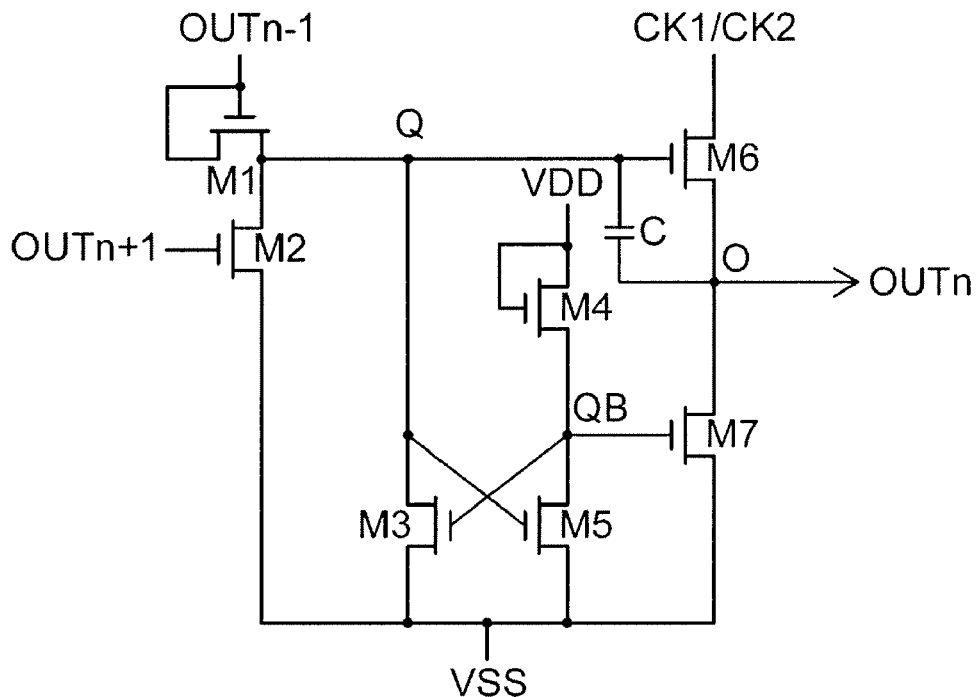
Figure 3:
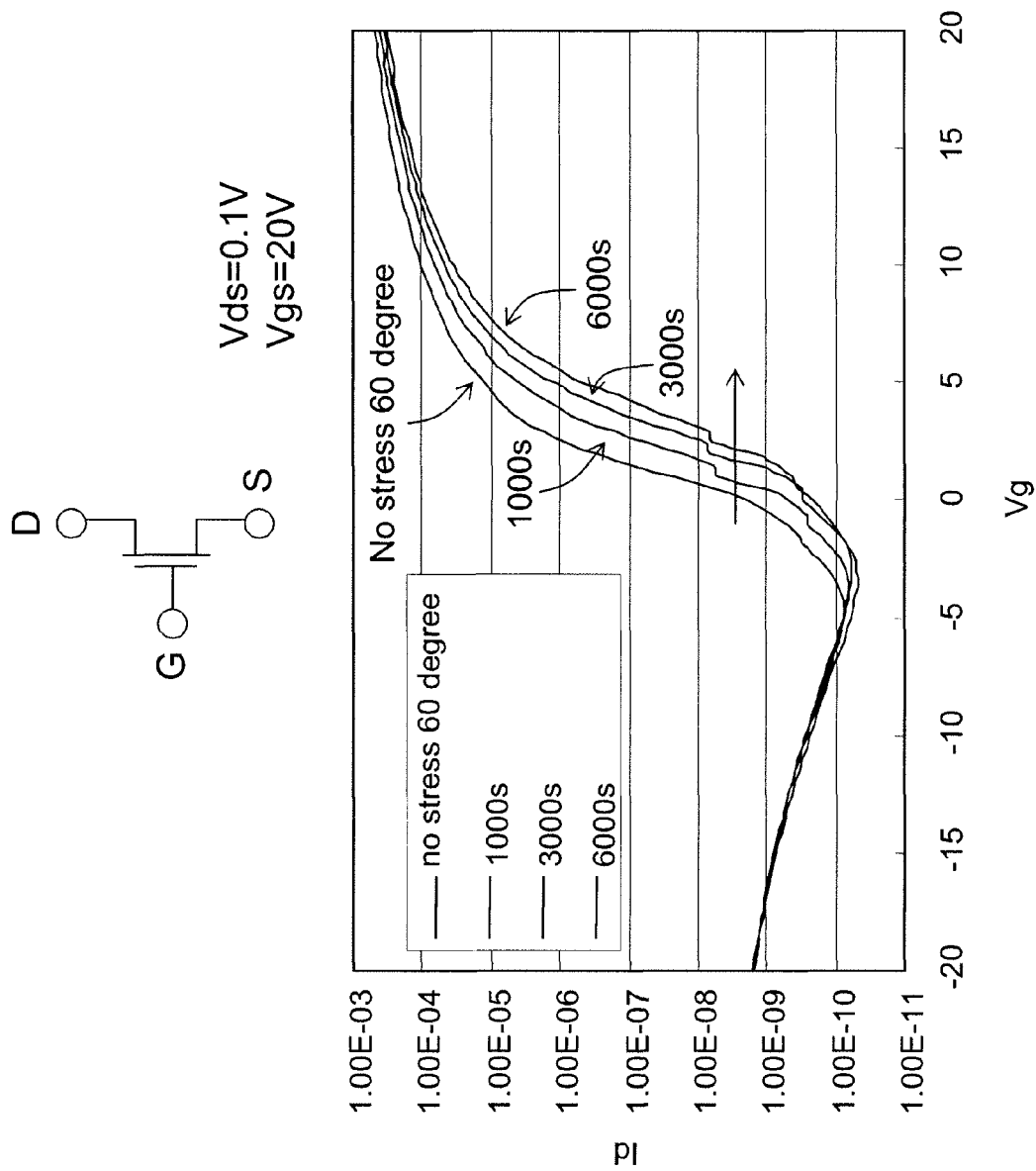
FIG. 3 shows current-voltage curves of a transistor.
Figure 4:
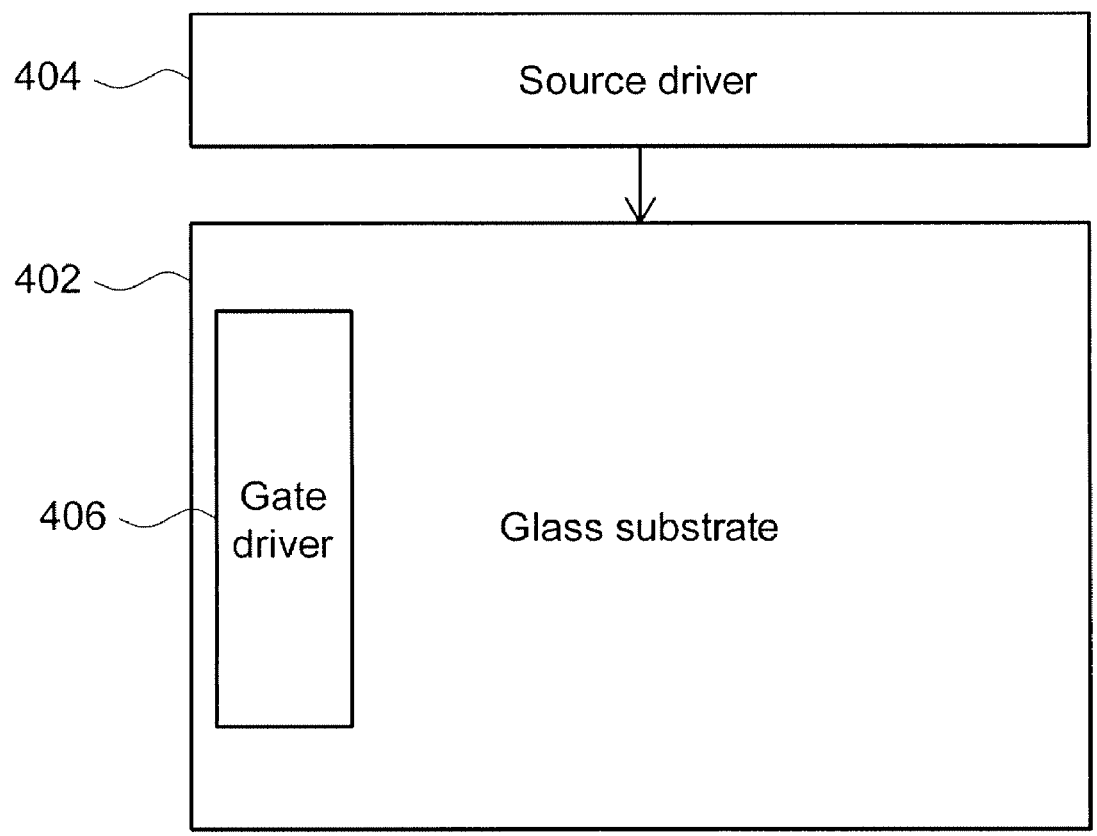
FIG. 4 is a schematic illustration of a display.

FIG. 4 is a diagram showing an example display 400 that includes a glass substrate 402, a source driver 404, and a gate driver 406. The glass substrate 402 includes an array of rows and columns of pixels. The gate driver 406 is disposed on the glass substrate 402. The gate driver 406 sequentially enables each row of pixels, and the source driver 404 writes pixel data to corresponding pixels.

Figure 5:
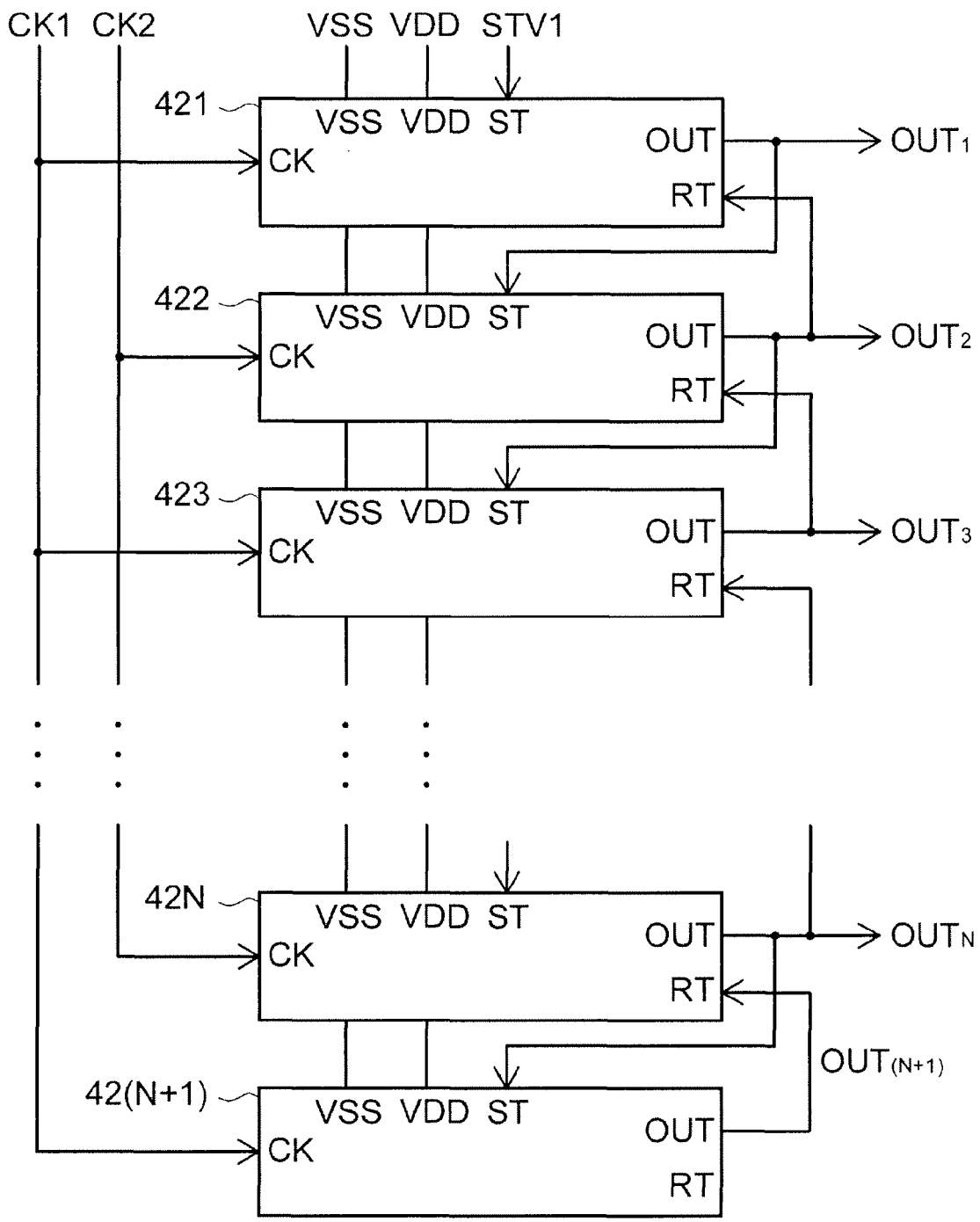
FIG. 5 is a block diagram of a gate driver.

FIG. 5 is a block diagram of an example gate driver 406. The gate driver 406 has an amorphous silicon gate (ASG) structure, which can be fabricated with a lower cost. The gate driver 406 has (N+1) shift registers $42x$ (x=1 to N+1), in which N is a positive integer. The shift register 42 (N+1) is a dummy shift register.

Figure 6:
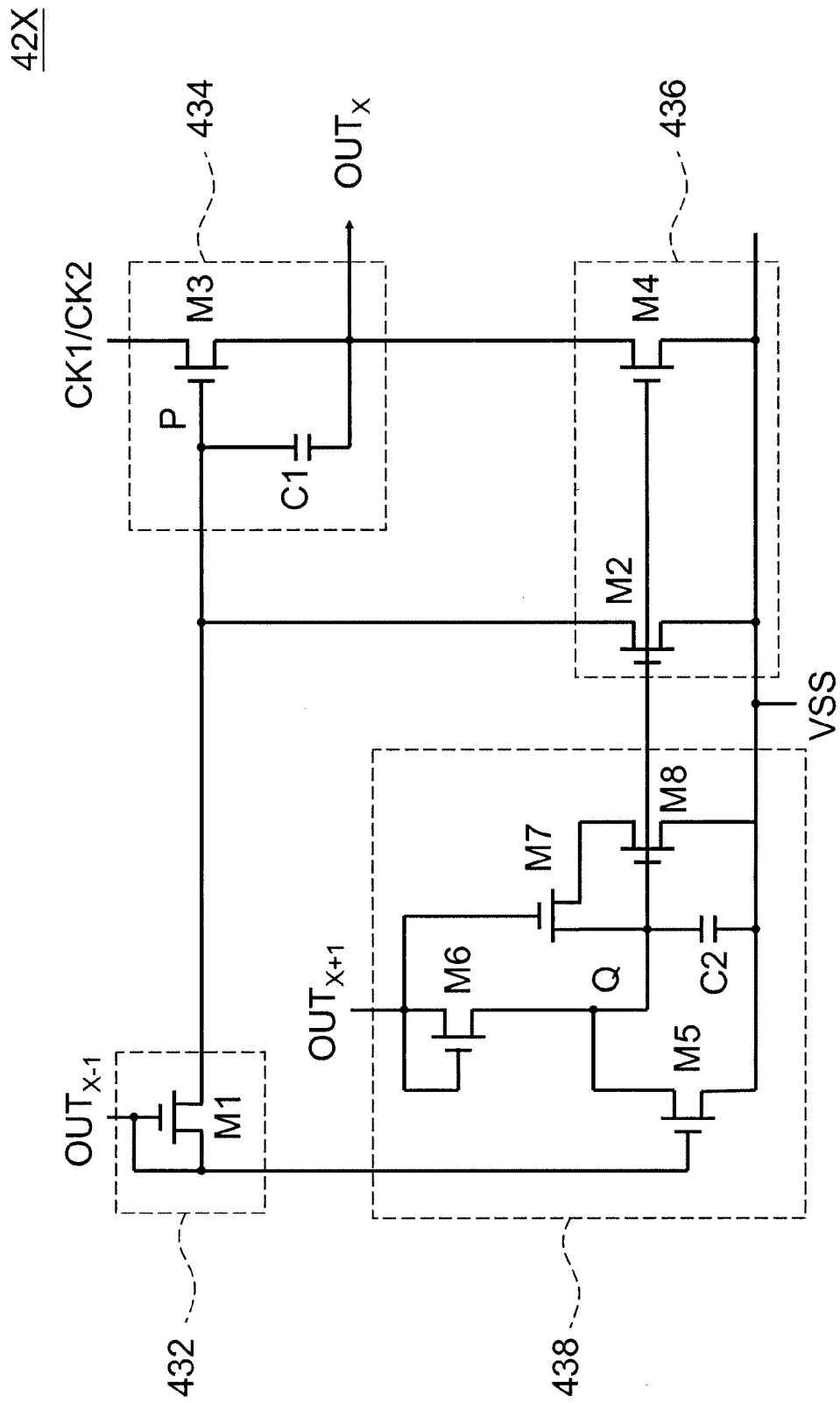
FIG. 6 is a circuit diagram of an example shift register.

FIG. 6 is a circuit diagram of an example shift register $42x$. The shift register $42x$ includes an input unit 432, an output unit 434, an output pull-down unit 436, and a threshold voltage memory unit 438.

In this description, each transistor (e.g., M1 to M8 of FIG. 6) is an N-type transistor that includes a control terminal, a first terminal, and a second terminal. The control terminal can be a gate terminal. The first and second terminals can be source and drain terminals.

The input unit 432 includes a first transistor M1 formed on the glass substrate 402. The control terminal of the first transistor M1 receives an output signal $OUT_{(x-1)}$ of the $(x-1)^{th}$ shift register $42(x-1)$ of the gate driver 406, and the first terminal of the first transistor M1 is coupled to the control terminal of the first transistor M1. A second transistor M2 is formed on the glass substrate 402. The first terminal of the second transistor M2 is coupled to the second terminal of the first transistor M1, and the second terminal of the second transistor M2 receives a low operation voltage VSS.

Figure 7:
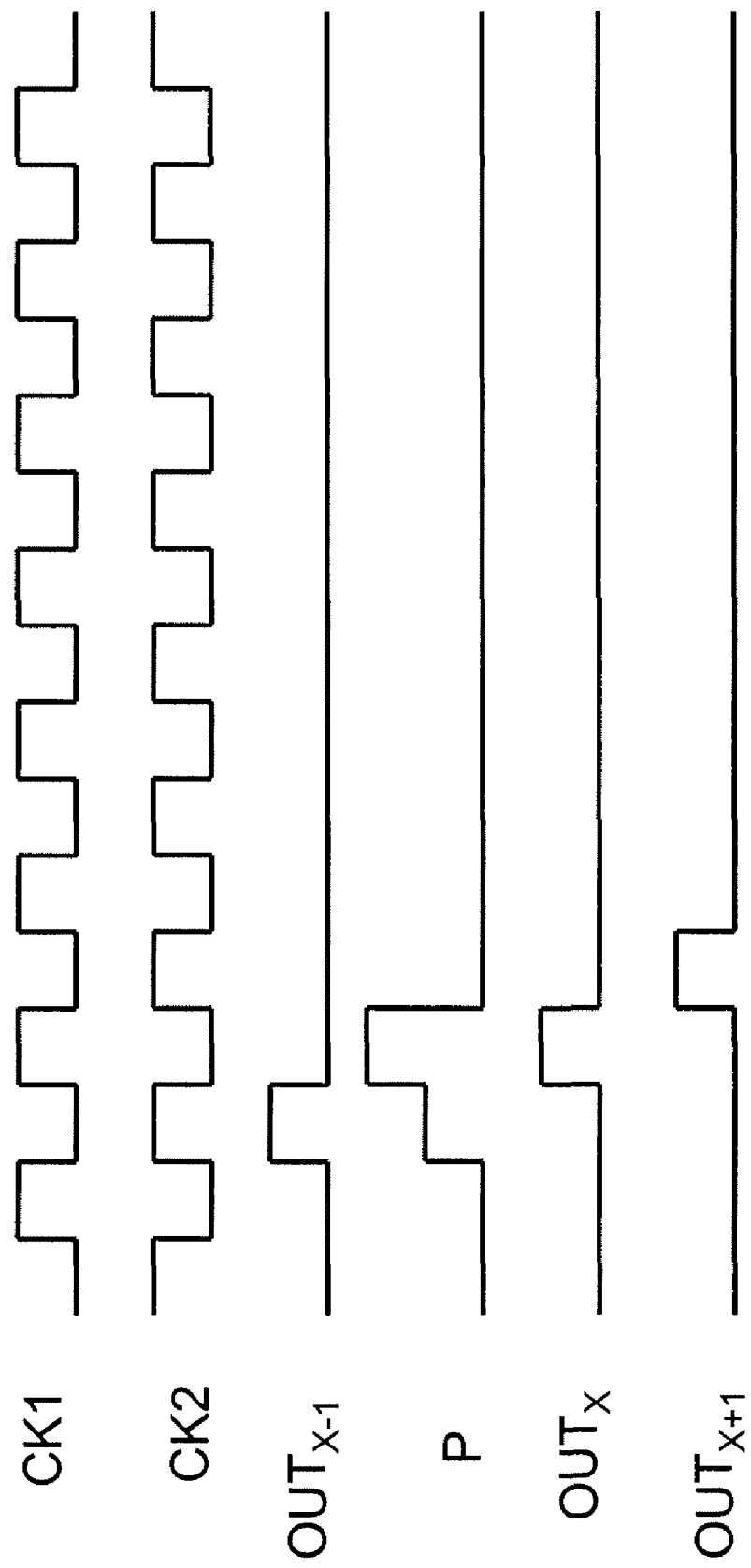
FIG. 7 shows timing diagrams corresponding to the shift register of FIG. 6.

A first clock signal CK1 and a second clock signal CK2 that have the same frequency but opposite phases are used (see FIG. 7). The output unit 434 includes a third transistor M3 and a first capacitor C1, and the output pull-down unit 436 includes the second transistor M2 and a fourth transistor M4. The third transistor M3 is formed on the glass substrate 402. The control terminal of the third transistor M3 is coupled to the second terminal of the first transistor M1, the first terminal of the third transistor M3 receives an $M^{th}$ clock signal (CK1 or CK2), and the second terminal of the third transistor M3 outputs an output signal $OUT_x$ of the shift register $42x$, in which M is equal to 1 when n is an odd number, and M is equal to 2 when n is an even number. That is, when the shift register $42x$ is an odd-numbered shift register, the first terminal of the third transistor M3 receives the first clock signal CK1, and when the shift register $42x$ is an even-numbered shift register, the first terminal of the third transistor M3 receives the second clock signal CK2.

The first terminal of the first capacitor C1 is coupled to the control terminal of the third transistor M3, and the second terminal of the first capacitor C1 is coupled to the second terminal of the third transistor M3. The fourth transistor M4 is formed on the glass substrate 402. The control terminal of the fourth transistor M4 is coupled to the control terminal of the second transistor M2, the first terminal of the fourth transistor M4 is coupled to the second terminal of the third transistor M3, and the second terminal of the fourth transistor M4 receives the low operation voltage VSS. A threshold voltage memory unit 430 is coupled to the first terminal of the first transistor M1 and the control terminal of the second transistor M2, and receives the low operation voltage VSS and an output signal $OUT_{(x+1)}$ of the $(x+1)^{th}$ shift register $42(x+1)$ of the gate driver 406.

The threshold voltage memory unit 438 includes fifth to eighth transistors M5 to M8 and a second capacitor C2. The fifth transistor M5 is formed on the glass substrate 402. The control terminal of the fifth transistor M5 is coupled to the first terminal of the first transistor M1, the first terminal of the fifth transistor M5 is coupled to the control terminal of the second transistor M2, and the second terminal of the fifth transistor M5 receives the low operation voltage VSS. The first terminal of the second capacitor C2 is coupled to the first terminal of the fifth transistor M5, and the second terminal of the second capacitor C2 is coupled to the second terminal of the fifth transistor M5.

The sixth transistor M6 is formed on the glass substrate 402. The control terminal of the sixth transistor M6 is coupled to the first terminal of the sixth transistor M6, the first terminal of the sixth transistor M6 receives the output signal $OUT_{(x+1)}$ of the $(x+1)^{th}$ shift register 42(x+1), and the second terminal of the sixth transistor M6 is coupled to the first terminal of the fifth transistor M5. The seventh transistor M7 is formed on the glass substrate 402. The control terminal of the seventh transistor M7 is coupled to the first terminal of the sixth transistor M6, and the first terminal of the seventh transistor M7 is coupled to the first terminal of the fifth transistor M5. The eighth transistor M8 is formed on the glass substrate 402. The control terminal of the eighth transistor M8 is coupled to the first terminal of the fifth transistor M5, the first terminal of the eighth transistor M8 is coupled to the second terminal of the seventh transistor M7, and the second terminal of the eighth transistor M8 receives the low operation voltage VSS.

FIG. 7 shows timing diagrams of example signals corresponding to the shift register 42x of FIG. 6. In the example of FIG. 7, it is assumed that x is an odd number. When the shift register 42x is enabled, the first transistor M1 is turned on by the output signal $OUT_{(x-1)}$ from the shift register 42(x-1), and the voltage level at a node P is changed to a high voltage level (e.g., the high operation voltage VDD) to turn on the third transistor M3. The voltage level at node P is further raised to allow a higher current to flow through the third transistor M3. Thus, one clock pulse of the first clock signal CK1 can be output as the output signal $OUT_x$ of the $x^{th}$ shift register 42x to drive the corresponding row of pixels. At this time, the fifth transistor M5 is also turned on to cause the voltage level at the node Q to be at the low operation voltage VSS. The eighth transistor M8, the second transistor M2, and the fourth transistor M4 are turned off.

When the output signal $OUT_{(x+1)}$ of the $(x+1)^{th}$ shift register 42(x+1) is at the high voltage level, the output signal $OUT_{(x-1)}$ of the $(x-1)^{th}$ shift register 42(x-1) is at the low voltage level (e.g., the low operation voltage VSS). The fifth transistor M5 is turned off and the sixth transistor M6 and the seventh transistor M7 are turned on such that the voltage level at node Q is at the high voltage level. Thus, the eighth transistor M8, the second transistor M2, and the fourth transistor M4 are turned on, and the voltage level at node P is changed to the low operation voltage VSS such that the third transistor M3 is turned off, and the $x^{th}$ output signal $OUT_x$ is outputted and maintained at the low operation voltage VSS.

At this time, the seventh transistor M7 and the eighth transistor M8 are turned on, and the voltage level of the node Q gradually decreases with the decrease of the currents flowing through the seventh transistor M7 and the eighth transistor M8 until a characteristic voltage is reached. The characteristic voltage is such that the eighth transistor M8 is maintained at an "on" state. The characteristic voltage relates to the threshold voltage of the eighth transistor M8, and the second capacitor C2 stores the characteristic voltage. Because the second transistor M2, the fourth transistor M4, and the eighth transistor M8 are designed to have similar sizes, so the threshold voltage of the eighth transistor M8 is substantially the same as the threshold voltages of the second transistor M2 and the fourth transistor M4. The transistors M2, M4, and M8 are turned on and off at substantially the same time, and the characteristic voltage stored in the second capacitor C2 keeps the second transistor M2 and the fourth transistor M4 at the "on" state. When the threshold voltages of the transistors M2, M4, and M8 are shifted due to being turned on for a long period of time, the amount of shift in the threshold voltage of transistor M8 is similar to the amount of shift in the threshold voltages of transistors M2 and M4. Thus, even if the threshold voltages of the second transistor M2 and the fourth transistor M4 are shifted due to being turned on for a long period of time, the characteristic voltage stored in the second capacitor C2 of the threshold voltage memory unit 430 still can turn on the second transistor M2 and the fourth transistor M4 in the next frame period.

Figure 8A:
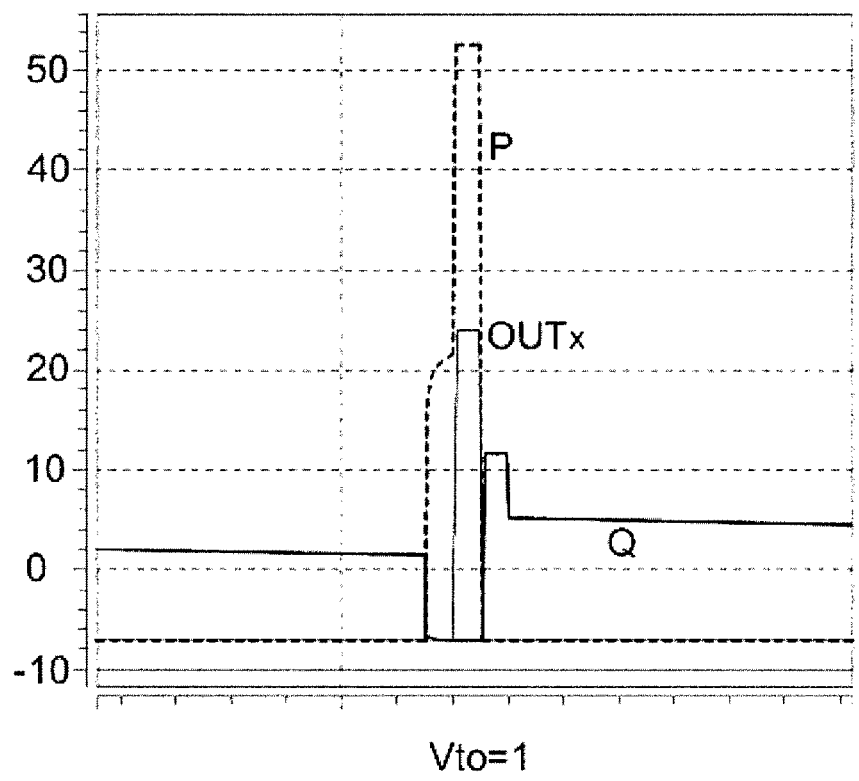
FIGS. 8A and 8B show simulated output waveforms corresponding to the shift register of FIG. 6.
Figure 8B:
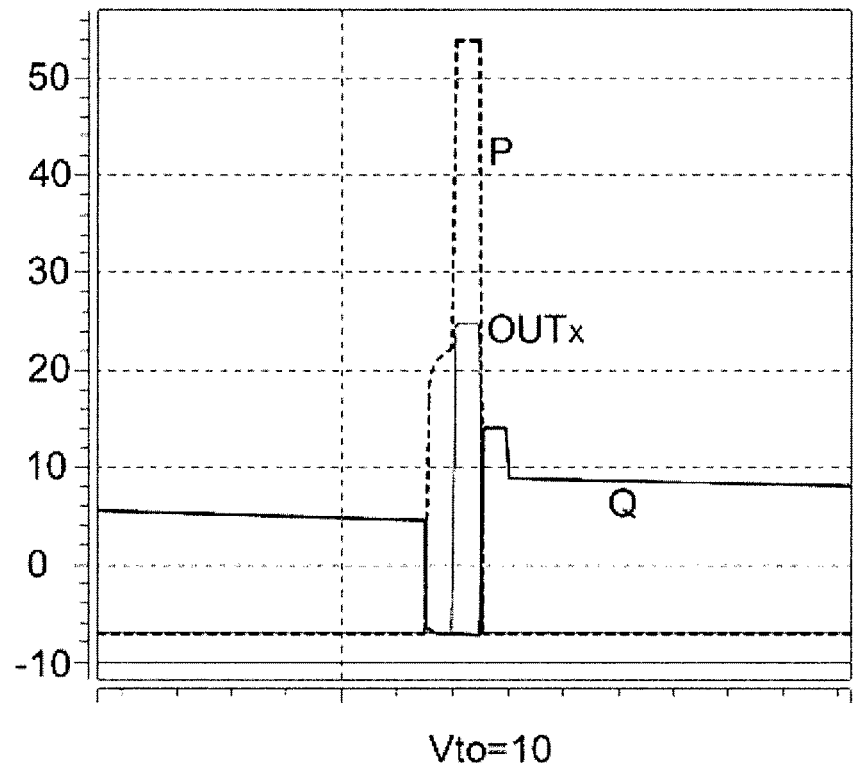

FIGS. 8A and 8B show simulated output waveforms corresponding to the shift register 42x of FIG. 6. The horizontal axis represents time. FIG. 8A shows the voltage waveforms at node P, node Q, and OUTx when the threshold voltage of the eighth transistor M8 is 1V, and FIG. 8B shows the voltage waveforms at node P, node Q, and OUTx when the threshold voltage of the eighth transistor M8 is 10V. Comparing FIG. 8B with FIG. 8A shows that the voltage level at node Q (which is the characteristic voltage stored in the second capacitor C2) changes with the change of the threshold voltage Vt0 of the eighth transistor M8. FIGS. 8A and 8B also show that the shift register 42x can keep the output signal $OUT_x$ at the low voltage level when the next shift register 42(x+1) has an output signal OUT(x+1) at a high level.

Figure 9:
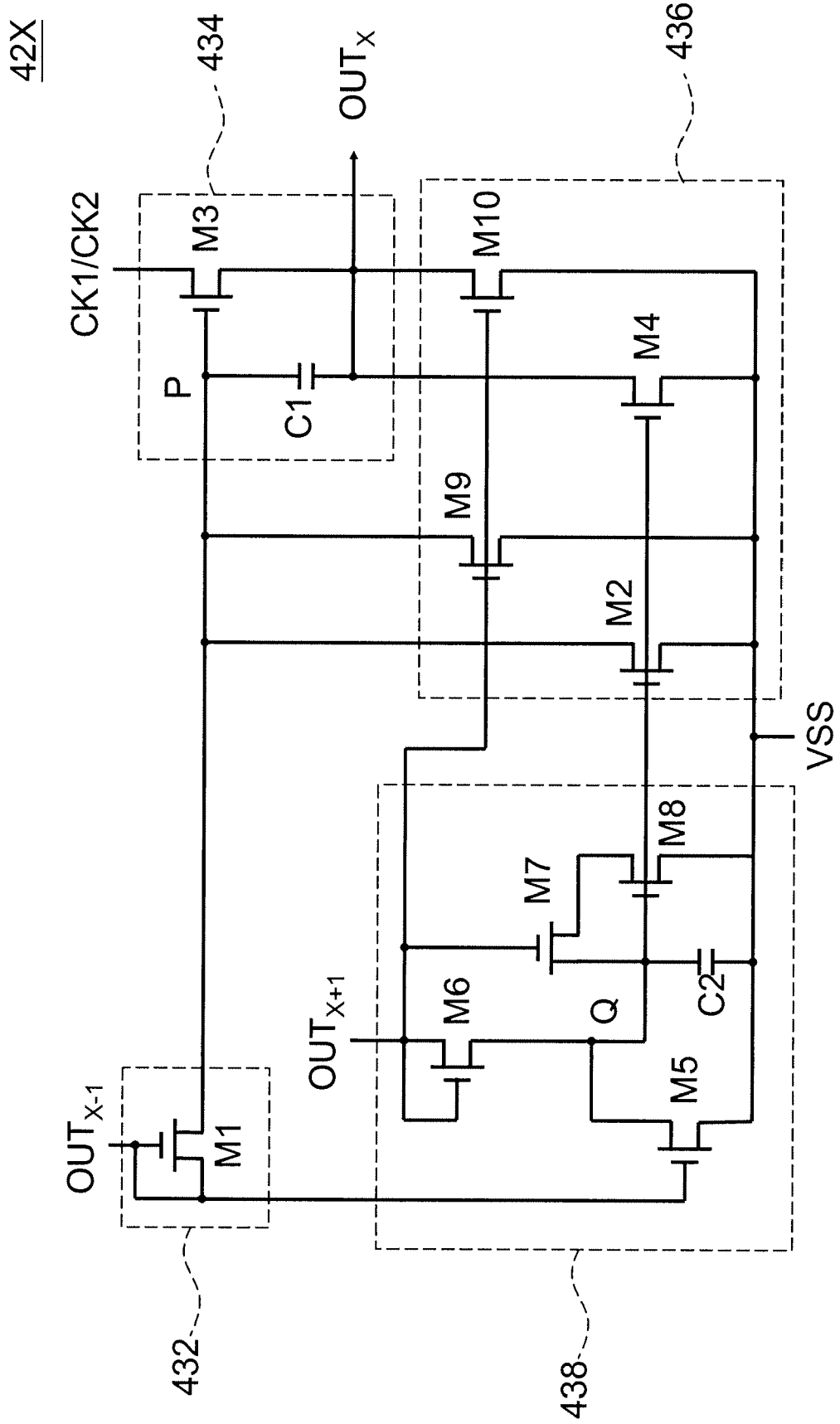
FIG. 9 is a circuit diagram of an example shift register.

FIG. 9 is a circuit diagram showing another example of the shift register 42x. In this example, a ninth transistor M9 and a tenth transistor M10 (both being N-type transistors) are added to the output pull-down unit 436 of the shift register 42x to ensure the output signal OUTx can be set to the low voltage level when the shift register 42x is not enabled.

In the shift register 42x, the ninth transistor M9 is formed on the glass substrate 402, the control terminal of the ninth transistor M9 receives the output signal $OUT_{(x+1)}$ of the $(x+1)^{th}$ shift register 42(x+1), the first terminal of the ninth transistor M9 is coupled to the second terminal of the first transistor M1, and the second terminal of the ninth transistor M9 receives the low operation voltage VSS. The tenth transistor M10 is formed on the glass substrate 402. The control terminal of the tenth transistor M10 receives the output signal $OUT_{(x+1)}$ of the $(x+1)^{th}$ shift register 42(x+1), the first terminal of the tenth transistor M10 is coupled to the second terminal of the third transistor M3, and the second terminal of the tenth transistor M10 receives the low operation voltage VSS. If the second transistor M2 or the fourth transistor M4 cannot operate normally, the ninth transistor M9 and the tenth transistor M10 can still keep the normal operation of the shift register 42x.

In the shift register 42x, when the output signal $OUT_{(x+1)}$ of the $(x+1)^{th}$ shift register 42(x+1) is at the high voltage level, the sixth transistor M6, the seventh transistor M7 and the eighth transistor M8 are simultaneously turned on, and the current may be wasted.

Figure 10:
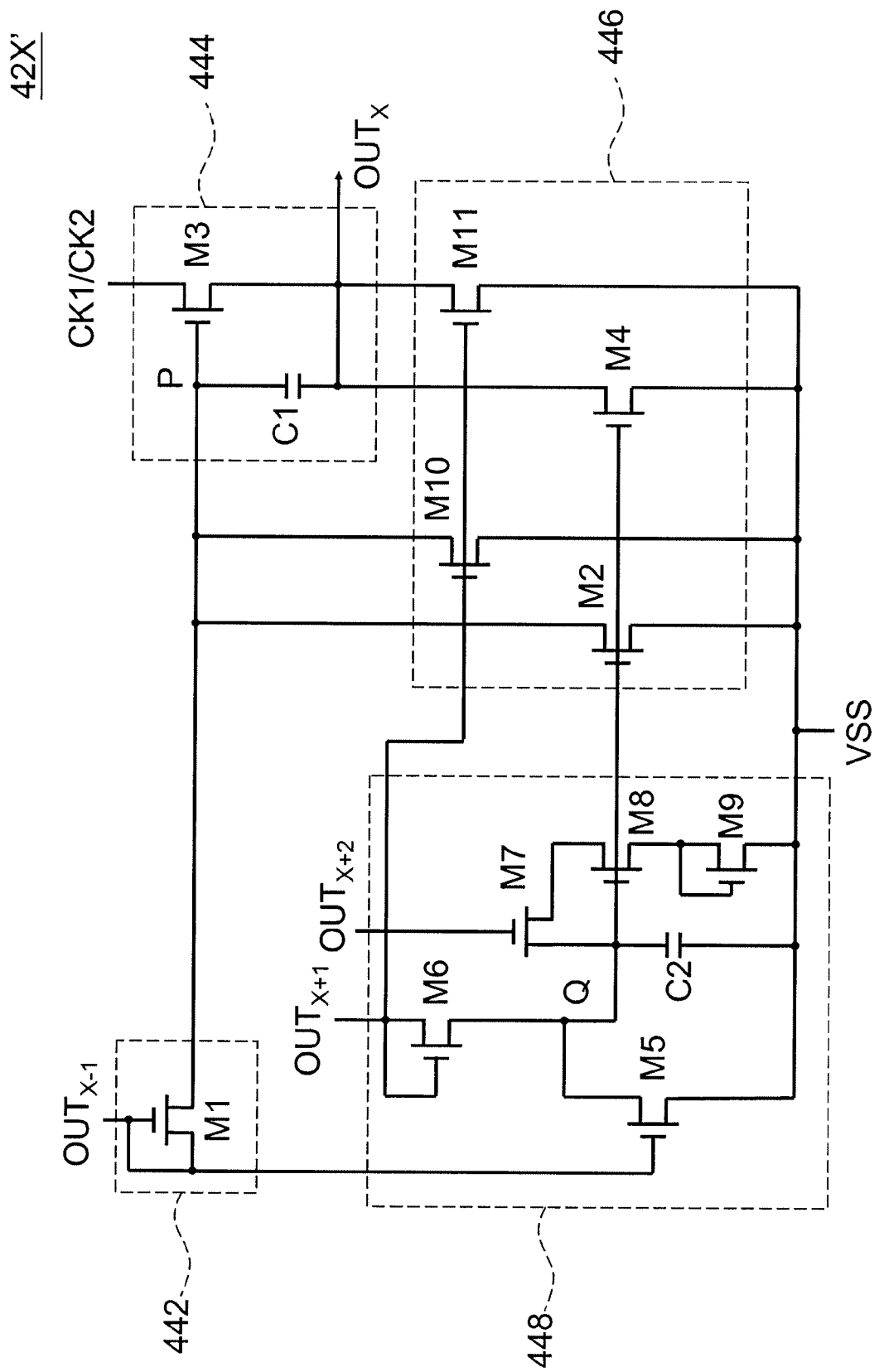
FIG. 10 is a circuit diagram of a shift register.

FIG. 10 is a circuit diagram of an example shift register 42x'. The circuit of the shift register 42x' is similar to the shift register 42x of FIG. 9 except that a threshold voltage memory unit 448 is coupled to the first terminal of the first transistor M1 and the control terminal of the second transistor M2, and receives the low operation voltage VSS, the output signal $OUT_{(x+1)}$ of the $(x+1)^{th}$ shift register 42(x+1) of the gate driver 406, and an output signal $OUT_{(x+2)}$ of the $(x+2)^{th}$ shift register 42(x+2) of the gate driver 406.

The threshold voltage memory unit 448 includes the fifth transistor M5, the second capacitor C2, the sixth transistor M6, the seventh transistor M7, the eighth transistor M8, and a ninth transistor M9. The fifth transistor M5 is formed on the glass substrate 402. The control terminal of the fifth transistor M5 is coupled to the first terminal of the first transistor M1, the first terminal of the fifth transistor M5 is coupled to the control terminal of the second transistor M2, and the second terminal of the fifth transistor M5 receives the low operation voltage VSS. The first terminal of the second capacitor C2 is coupled to the first terminal of the fifth transistor M5, and the second terminal of the second capacitor C2 is coupled to the second terminal of the fifth transistor M5. The sixth transistor M6 is formed on the glass substrate 402. The control terminal of the sixth transistor M6 is coupled to the first terminal of the sixth transistor M6, the first terminal of the sixth transistor M6 receives the output signal $OUT_{(x+1)}$ of the $(x+1)^{th}$ shift register 42(x+1), and the second terminal of the sixth transistor M6 is coupled to the first terminal of the fifth transistor M5.

The seventh transistor M7 is formed on the glass substrate 402. The control terminal of the seventh transistor M7 receives the output signal $OUT_{(x+2)}$ of the $(x+2)^{th}$ shift register 42(x+2). The first terminal of the seventh transistor M7 is coupled to the first terminal of the fifth transistor M5. The eighth transistor M8 is formed on the glass substrate 402. The control terminal of the eighth transistor M8 is coupled to the first terminal of the fifth transistor M5, and the first terminal of the eighth transistor M8 is coupled to the second terminal of the seventh transistor M7. The ninth transistor M9 is formed on the glass substrate 402. The control terminal of the ninth transistor M9 is coupled to the second terminal of the eighth transistor M8 and the first terminal of the ninth transistor M9, and the second terminal of the ninth transistor M9 receives the low operation voltage VSS. The ninth transistor M9 may be substantially regarded as a diode.

When the output signal $OUT_{(x+1)}$ of the $(x+1)^{th}$ shift register 42(x+1) is at the high voltage level, the output signal $OUT_{(x-1)}$ of the $(x-1)^{th}$ shift register 42(x-1) is at the low voltage level, the fifth transistor M5 is turned off and the sixth transistor M6 is turned on such that the voltage level at the node Q is high. Thus, the eighth transistor M8, the second transistor M2 and the fourth transistor M4 are turned on, and the output signal $OUT_x$ is outputted and maintained at the low operation voltage VSS. When the output signal $OUT_{(x+2)}$ of the $(x+2)^{th}$ shift register 42(x+2) is at the high voltage level, the seventh transistor M7 is turned on, and the second capacitor C2 stores the characteristic voltage, which is substantially a sum of the threshold voltages of the eighth transistor M8 and the ninth transistor M9.

Because the second transistor M2, the fourth transistor M4, and the eighth transistor M8 are synchronously turned off and on, the characteristic voltage stored in the second capacitor C2 relates to the threshold voltages of the second transistor M2 and the fourth transistor M4. Thus, even if the threshold voltages of the second transistor M2 and the fourth transistor M4 are shifted due to be turned on for a long period of time, the characteristic voltage stored in the second capacitor C2 of a threshold voltage memory unit 448 still can turn on the second transistor M2 and the fourth transistor M4 in the next frame period. In addition, the shift register 42x' includes a tenth transistor M10 and an eleventh transistor M11 in an output pull-down unit 446. If the second transistor M2 or the fourth transistor M4 cannot operate normally, the tenth transistor M10 and the eleventh transistor M11 can still maintain the normal operation of the shift register 42x'. In this example, the transistors M1 to M11 are N-type MOSFETs.

Figure 11A:
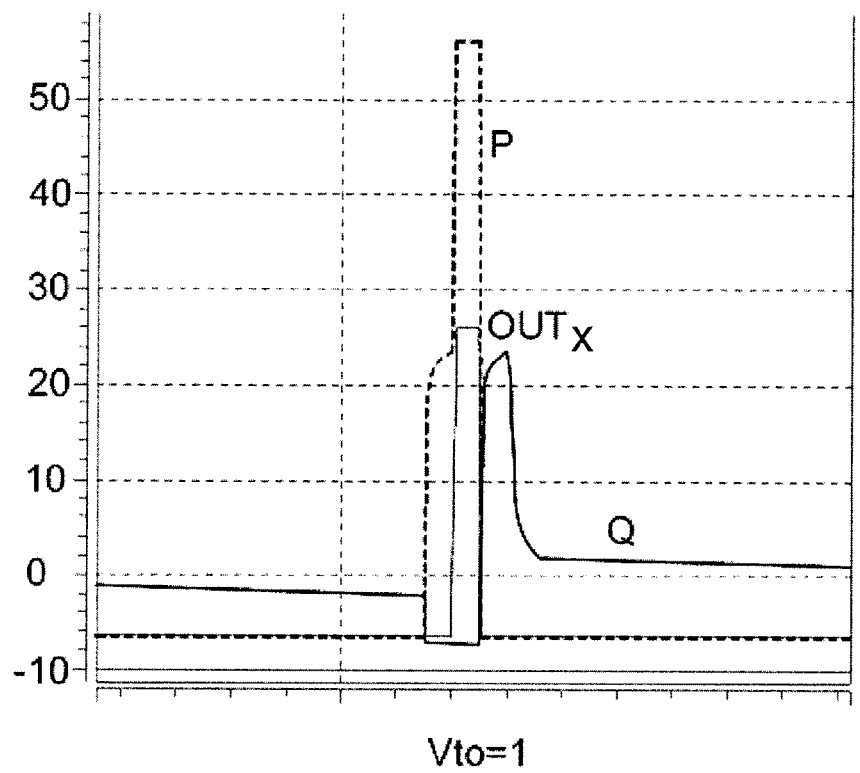
FIGS. 11A and 11B show simulated output waveforms corresponding to the shift register of FIG. 10.
Figure 11B:
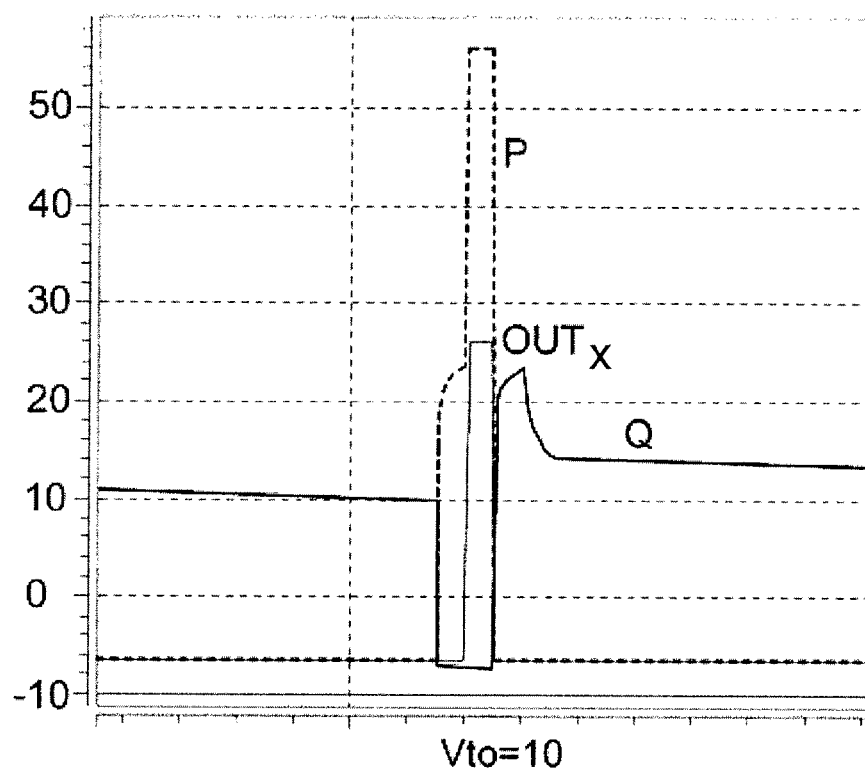

FIGS. 11A and 11B show simulated output waveforms corresponding to the shift register 42x'. FIG. 11A shows the voltage waveforms at node P, node Q, and OUTx when the threshold voltage of the eighth transistor M8 is 1V, and FIG. 11B shows the voltage waveforms at node P, node Q, and OUTx when the threshold voltage of the eighth transistor M8 is 10V. Comparing FIG. 11B with FIG. 11A shows that the voltage level at the node Q (which is the characteristic voltage stored in the second capacitor C2) changes with the change of the threshold voltage Vt0 of the eighth transistor M8. FIGS. 11A and 11B also show that the shift register 42x' can keep the output signal $OUT_x$ at the low voltage level when the next shift register 42(x+1) has an output signal OUT(x+1) at a high level.

Figure 12:
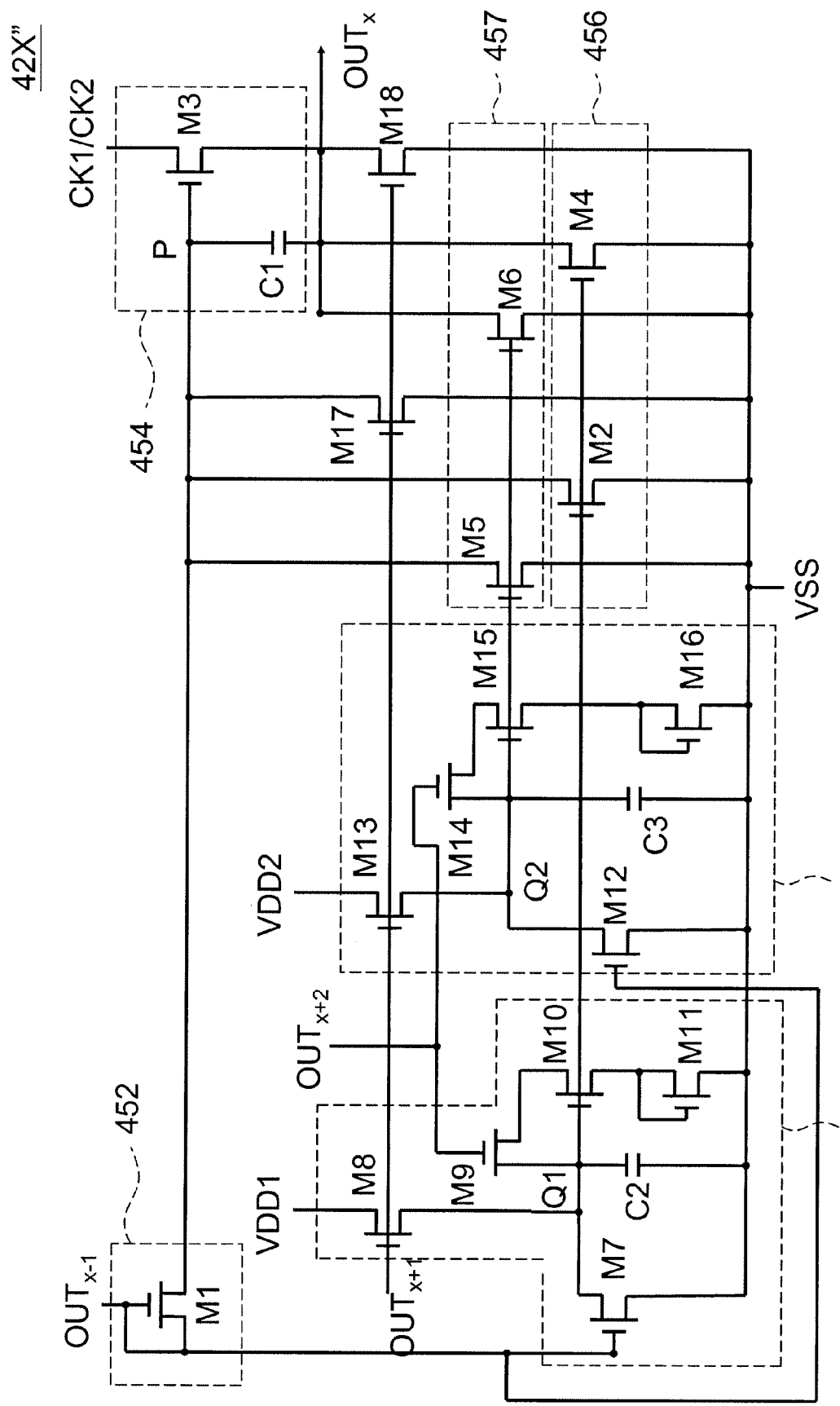
FIG. 12 is a circuit diagram of a shift register.

FIG. 12 is a circuit diagram of an example shift register 42x''. The circuit of the shift register 42x'' is similar to the shift register 42x' of FIG. 10 except for the following difference. Compared with the shift register 42x' that includes the output pull-down unit 446 and the threshold voltage memory unit 448, the shift register 42x'' includes a first output pull-down unit 456, a second output pull-down unit 457, a first threshold voltage memory unit 458, and a second threshold voltage memory unit 459. The first output pull-down unit 456 includes a second transistor M2 and a fourth transistor M4, while the second output pull-down unit 457 includes a fifth transistor M5 and a sixth transistor M6.

The first threshold voltage memory unit 458 is coupled to the first terminal of the first transistor M1 and the control terminal of the second transistor M2, and receives a first operation voltage VDD1, the low operation voltage VSS, the output signal $OUT_{(x+1)}$ of the $(x+1)^{th}$ shift register 42(x+1) of the gate driver 406, and the output signal $OUT_{(x+2)}$ of the $(x+2)^{th}$ shift register 42(x+2) of the gate driver 406. The second threshold voltage memory unit 459 is coupled to the second terminal of the first transistor M1 and the control terminal of the fifth transistor M5, and receives a second operation voltage VDD2, the low operation voltage VSS, the output signal $OUT_{(x+1)}$ of the $(x+1)^{th}$ shift register 42(x+1), and the output signal $OUT_{(x+2)}$ of the $(x+2)^{th}$ shift register 42(x+2).

The first threshold voltage memory unit 458 includes a seventh transistor M7, a second capacitor C2, an eighth transistor M8, a ninth transistor M9, a tenth transistor M10, and an eleventh transistor M11. The seventh transistor M7 is formed on the glass substrate 402. The control terminal of the seventh transistor M7 is coupled to the first terminal of the first transistor M1, the first terminal of the seventh transistor M7 is coupled to the control terminal of the second transistor M2, and the second terminal of the seventh transistor M7 receives the low operation voltage VSS. The first terminal of the second capacitor C2 is coupled to the first terminal of the seventh transistor M7, and the second terminal of the second capacitor C2 is coupled to the second terminal of the seventh transistor M7.

The eighth transistor M8 is formed on the glass substrate 402. The control terminal of the eighth transistor M8 receives the output signal $OUT_{(x+1)}$ of the $(x+1)^{th}$ shift register 42(x+1), the first terminal of the eighth transistor M8 receives the first operation voltage VDD1, and the second terminal of the eighth transistor M8 is coupled to the first terminal of the seventh transistor M7. The ninth transistor M9 is formed on the glass substrate 402, the control terminal of the ninth transistor M9 receives the output signal $OUT_{(x+2)}$ of the $(x+2)^{th}$ shift register 42(x+2), and the first terminal of the ninth transistor M9 is coupled to the first terminal of the seventh transistor M7. The tenth transistor M10 is formed on the glass substrate 402. The control terminal of the tenth transistor M10 is coupled to the first terminal of the seventh transistor M7, and the first terminal of the tenth transistor M10 is coupled to the second terminal of the ninth transistor M9. The eleventh transistor M11 is formed on the glass substrate 402, the control terminal of the eleventh transistor M11 is coupled to the second terminal of the tenth transistor M10 and the first terminal of the eleventh transistor M11, and the second terminal of the eleventh transistor M11 receives the low operation voltage VSS.

The second threshold voltage memory unit 459 includes a twelfth transistor M12, a third capacitor C3, a thirteenth transistor M13, a fourteenth transistor M14, a fifteenth transistor M15 and a sixteenth transistor M16. The twelfth transistor M12 is formed on the glass substrate 402. The control terminal of the twelfth transistor M12 is coupled to the first terminal of the first transistor M1, the first terminal of the twelfth transistor M12 is coupled to the control terminal of the fifth transistor M5, and the second terminal of the twelfth transistor M12 receives the low operation voltage VSS. The first terminal of the third capacitor C3 is coupled to the first terminal of the twelfth transistor M12, and the second terminal of the third capacitor C3 is coupled to the second terminal of the twelfth transistor M12.

The thirteenth transistor M13 is formed on the glass substrate 402. The control terminal of the thirteenth transistor M13 receives the output signal $OUT_{(x+1)}$ of the $(x+1)^{th}$ shift register 42(x+1), the first terminal of the thirteenth transistor M13 receives the second operation voltage VDD2, and the second terminal of the thirteenth transistor M13 is coupled to the first terminal of the twelfth transistor M12. The fourteenth transistor M14 is formed on the glass substrate 402. The control terminal of the fourteenth transistor M14 receives the output signal $OUT_{(x+2)}$ of the $(x+2)^{th}$ shift register 42(x+2), and the first terminal of the fourteenth transistor M14 is coupled to the first terminal of the twelfth transistor M12. The fifteenth transistor M15 is formed on the glass substrate 402. The control terminal of the fifteenth transistor M15 is coupled to the first terminal of the fourteenth transistor M14, and the first terminal of the fifteenth transistor M15 is coupled to the second terminal of the fourteenth transistor M14. The sixteenth transistor M16 is formed on the glass substrate 402. The control terminal of the sixteenth transistor M16 is coupled to the second terminal of the fifteenth transistor M15 and the first terminal of the sixteenth transistor M16, and the second terminal of the sixteenth transistor M16 receives the low operation voltage VSS. In this example, the transistors M1 to M18 are N-type MOSFETs.

Figures 13A, 13B:
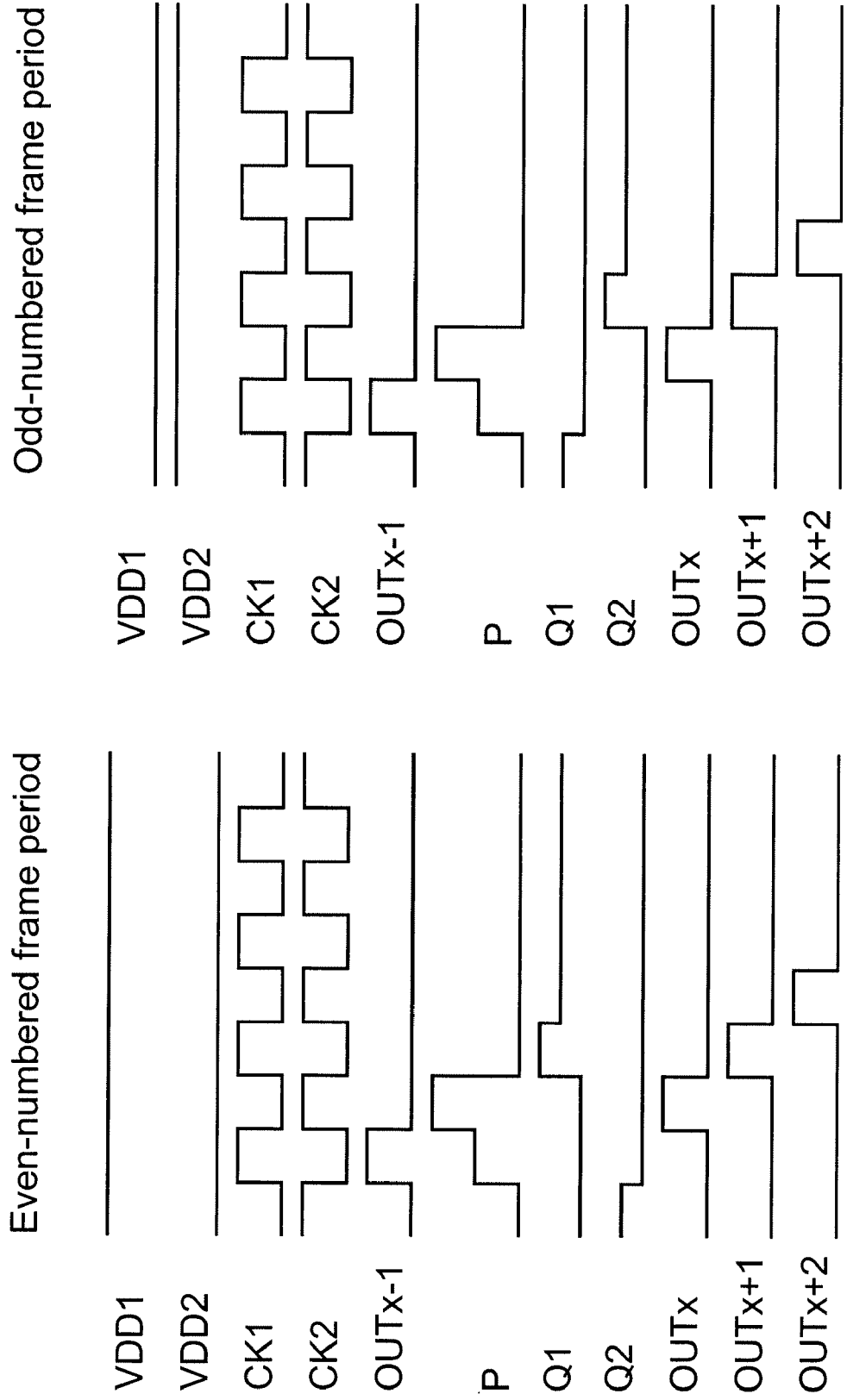
FIGS. 13A and 13B show timing diagrams corresponding to the shift register of FIG. 12.

FIGS. 13A and 13B show timing diagrams corresponding to the shift register 42x". Referring to FIG. 13A, in the even-numbered frame period, the first operation voltage VDD1 is at the high voltage level, the second operation voltage VDD2 is at the low voltage level, and the second threshold voltage memory unit 459 does not work. When the output signal $OUT_{(x+1)}$ of the $(x+1)^{th}$ shift register 42(x+1) is at the high voltage level, the eighth transistor M8 is turned on such that the tenth transistor M10, the second transistor M2 and the fourth transistor M4 are turned on, and the output signal $OUT_x$ is changed to and maintained at the low voltage level. Thus, the second transistor M2 and the fourth transistor M4 keep the output signal $OUT_x$ at the low voltage level in the even-numbered frame period. When the output signal $OUT_{(x+2)}$ of the $(x+2)^{th}$ shift register 42(x+2) is at the high voltage level, the ninth transistor M9 is turned on, and the second capacitor C2 stores the first characteristic voltage, which substantially relates to the threshold voltages of the second transistor M2 and the fourth transistor M4. Thus, in the even-numbered frame period, the first characteristic voltage stored in the second capacitor C2 of the first threshold voltage memory unit 458 can turn on the second transistor M2 and the fourth transistor M4 in the next even-numbered frame period.

Referring to FIG. 13B, in the odd-numbered frame period, the first operation voltage VDD1 is at the low voltage level, the second operation voltage VDD2 is at the high voltage level, and the first threshold voltage memory unit 458 does not work. When the output signal $OUT_{(x+1)}$ of the $(x+1)^{th}$ shift register 42(x+1) is at the high voltage level, the thirteenth transistor M13 is turned on such that the fifteenth transistor M15, the fifth transistor M5 and the sixth transistor M6 are turned on and the output signal $OUT_x$ is changed to and maintained at the low voltage level. The fifth transistor M5 and the sixth transistor M6 keep the output signal $OUT_x$ at the low voltage level in the odd-numbered frame period. When the output signal $OUT_{(x+2)}$ of the $(x+2)^{th}$ shift register 42(x+2) is at the high voltage level, the fourteenth transistor M14 is turned on, and the third capacitor C3 stores the second characteristic voltage, which substantially relates to the threshold voltages of the fifth transistor M5 and the sixth transistor M6. Thus, in the odd-numbered frame period, the second characteristic voltage stored in the third capacitor C3 of the second threshold voltage memory unit 459 can turn on the fifth transistor M5 and the sixth transistor M6 in the next odd-numbered frame period.

Because the first threshold voltage memory unit 458 and the second threshold voltage memory unit 459 respectively work in the even-numbered frame period and the odd-numbered frame period, the second transistor M2 and the fourth transistor M4, as well as the fifth transistor M5 and the sixth transistor M6 substantially work in one half of duty cycle and their life time is thus lengthened. In addition, the shift register 42x" further includes a seventeenth transistor M17 and an eighteenth transistor M18. If the second transistor M2, the fourth transistor M4, the fifth transistor M5 or the sixth transistor M6 cannot operate properly, the seventeenth transistor M17 and the eighteenth transistor M18 can still keep the normal operation of the shift register 42x".

In the examples of the display described above, the threshold voltage memory unit stores the characteristic voltage relating to the threshold voltage of the transistor so that the transistor in the shift register can operate normally even when the current-voltage characteristics of the transistor is shifted after the transistor is operated for a long period of time. This way, the shift register can operate properly. In some examples, two threshold voltage memory units may be utilized to perform the storing of characteristic voltages in different frame periods so that the life time of the transistors in each threshold voltage memory unit can be lengthened.

Although some examples have been discussed above, other implementations and applications are also within the scope of the following claims. For example, the waveforms can be different from those described above. P-type transistors can be used in the examples shown in FIGS. 6, 9, 10, and 12, in which the polarities of various signals are adjusted accordingly. The shift registers can be used in various types of displays other than liquid crystal displays. The logic signal levels can be different from the examples above. For example, the display can use logic circuit such that each shift register has an output that is normally high and changes to low to enable a row of pixels.

What is claimed is:
1. A display, comprising:
a glass substrate comprising a plurality of pixels;
a source driver for driving the pixels; and a gate driver, disposed on the glass substrate, for enabling the pixels, wherein the gate driver has (N+1) shift registers, N is a positive integer, and the nth shift register comprises:

an input unit for receiving an output signal of the $(n-1)^{th}$ shift register of the gate driver, the input unit including:

a first transistor, wherein a control terminal of the first transistor receives the output signal of the $(n-1)^{th}$ shift register of the gate driver, and a first terminal of the first transistor is coupled to the control terminal of the first transistor;

an output unit, coupled to the input unit, for receiving an $M^{th}$ clock signal and outputting an output signal of the $n^{th}$ shift register, wherein M is equal to 1 when n is an odd number, and M is equal to 2 when n is an even number, and the output unit includes:

a third transistor, wherein a control terminal of the third transistor is coupled to a second terminal of the first transistor, a first terminal of the third transistor receives the $M^{th}$ clock signal, and a second terminal of the third transistor outputs the output signal of the $n^{th}$ shift register, wherein M is equal to 1 when n is the odd number, and M is equal to 2 when n is the even number; and a first capacitor, wherein a first terminal of the first capacitor is coupled to the control terminal of the third transistor, and a second terminal of the first capacitor is coupled to the second terminal of the third transistor;

an output pull-down unit, coupled to the output unit, for receiving a low operation voltage, the output pull-down unit including:

a second transistor, wherein a first terminal of the second transistor is coupled to the second terminal of the first transistor, and a second terminal of the second transistor receives the low operation voltage; and a fourth transistor, wherein a control terminal of the fourth transistor is coupled to a control terminal of the second transistor, a first terminal of the fourth transistor is coupled to the second terminal of the third transistor, and a second terminal of the fourth transistor receives the low operation voltage; and a threshold voltage memory unit, coupled to the input unit and the output pull-down unit, for receiving the low operation voltage and an output signal of the $(n+1)^{th}$ shift register of the gate driver, the threshold voltage memory unit including:

a fifth transistor formed on the glass substrate, wherein a control terminal of the fifth transistor is coupled to the first terminal of the first transistor, a first terminal of the fifth transistor is coupled to the control terminal of the second transistor, and a second terminal of the fifth transistor receives the low operation voltage;

a second capacitor, wherein a first terminal of the second capacitor is coupled to the first terminal of the fifth transistor, and a second terminal of the second capacitor is coupled to the second terminal of the fifth transistor;

a sixth transistor formed on the glass substrate, wherein a control terminal of the sixth transistor is coupled to a first terminal of the sixth transistor, which receives the output signal of the $(n+1)^{th}$ shift register, and a second terminal of the sixth transistor is coupled to the first terminal of the fifth transistor;

a seventh transistor formed on the glass substrate, wherein a control terminal of the seventh transistor is coupled to the first terminal of the sixth transistor, and a first terminal of the seventh transistor is coupled to the first terminal of the fifth transistor; and an eighth transistor formed on the glass substrate, wherein a control terminal of the eighth transistor is coupled to the first terminal of the fifth transistor, a first terminal of the eighth transistor is coupled to a second terminal of the seventh transistor, and a second terminal of the eighth transistor receives the low operation voltage, wherein:

n is a positive integer ranging from 1 to (N+1); and when the output signal of the $(n+1)^{th}$ shift register is at a high voltage level, the threshold voltage memory unit turns on the output pull-down unit such that the output signal of the $n^{th}$ shift register is transformed into and maintained at a low voltage level, and the threshold voltage memory unit stores a characteristic voltage relating to a threshold voltage of the output pull-down unit.

2. The display according to claim 1, wherein when the output signal of the (n+1)th shift register is at the high voltage level, the sixth transistor and the seventh transistor are turned on such that the eighth transistor, the second transistor and the fourth transistor are turned on, the second capacitor stores the characteristic voltage, and the output signal of the nth shift register is transformed into and kept at the low voltage level.

3. A display, comprising:

a glass substrate comprising a plurality of pixels;

a source driver for driving the pixels; and a gate driver, disposed on the glass substrate, for enabling the pixels, wherein the gate driver has (N+1) shift registers, N is a positive integer, and the nth shift register comprises:

an input unit for receiving an output signal of the $(n-1)^{th}$ shift register of the gate driver, the input unit including:

a first transistor, wherein a control terminal of the first transistor receives the output signal of the $(n-1)^{th}$ shift register of the gate driver, and a first terminal of the first transistor is coupled to the control terminal of the first transistor;

an output unit, coupled to the input unit, for receiving an $M^{th}$ clock signal and outputting an output signal of the $n^{th}$ shift register, wherein M is equal to 1 when n is an odd number, and M is equal to 2 when n is an even number, and the output unit includes:

a third transistor, wherein a control terminal of the third transistor is coupled to a second terminal of the first transistor, a first terminal of the third transistor receives the $M^{th}$ clock signal, and a second terminal of the third transistor outputs the output signal of the $n^{th}$ shift register, wherein M is equal to 1 when n is the odd number, and M is equal to 2 when n is the even number; and a first capacitor, wherein a first terminal of the first capacitor is coupled to the control terminal of the third transistor, and a second terminal of the first capacitor is coupled to the second terminal of the third transistor;

an output pull-down unit, coupled to the output unit, for receiving a low operation voltage, the output pull-down unit including:

a second transistor, wherein a first terminal of the second transistor is coupled to the second terminal of the first transistor, and a second terminal of the second transistor receives the low operation voltage; and a fourth transistor, wherein a control terminal of the fourth transistor is coupled to a control terminal of the second transistor, a first terminal of the fourth transistor is coupled to the second terminal of the third transistor, and a second terminal of the fourth transistor receives the low operation voltage; and a threshold voltage memory unit, coupled to the input unit and the output pull-down unit, for receiving the low operation voltage, an output signal of the $(n+1)^{th}$ shift register of the gate driver, and an output signal of the $(n+2)^{th}$ shift register of the gate driver, the threshold voltage memory unit including:

a fifth transistor formed on the glass substrate, wherein a control terminal of the fifth transistor is coupled to the first terminal of the first transistor, a first terminal of the fifth transistor is coupled to the control terminal of the second transistor, and a second terminal of the fifth transistor receives the low operation voltage;

a second capacitor, wherein a first terminal of the second capacitor is coupled to the first terminal of the fifth transistor, and a second terminal of the second capacitor is coupled to the second terminal of the fifth transistor;

a sixth transistor formed on the glass substrate, wherein a control terminal of the sixth transistor is coupled to a first terminal of the sixth transistor, which receives the output signal of the $(n+1)^{th}$ shift register, and a second terminal of the sixth transistor is coupled to the first terminal of the fifth transistor;

a seventh transistor formed on the glass substrate, wherein a control terminal of the seventh transistor receives the output signal of the $(n+2)^{th}$ shift register, and a first terminal of the seventh transistor is coupled to the first terminal of the fifth transistor;

an eighth transistor formed on the glass substrate, wherein a control terminal of the eighth transistor is coupled to the first terminal of the fifth transistor, and a first terminal of the eighth transistor is coupled to a second terminal of the seventh transistor; and a ninth transistor formed on the glass substrate, wherein a control terminal of the ninth transistor is coupled to a second terminal of the eighth transistor and a first terminal of the ninth transistor, and a second terminal of the ninth transistor receives the low operation voltage, wherein:

n is a positive integer ranging from 1 to (N+1);

when the output signal of the $(n+1)^{th}$ shift register is at a high voltage level, the threshold voltage memory unit turns on the output pull-down unit such that the output signal of the $n^{th}$ shift register is transformed into and maintained at a low voltage level; and when the output signal of the $(n+2)^{th}$ shift register is at the high voltage level, the threshold voltage memory unit stores a characteristic voltage relating to a threshold voltage of the output pull-down unit.

4. The display according to claim 3, wherein:

when the output signal of the (n+1)th shift register is at the high voltage level, the sixth transistor is turned on such that the eighth transistor, the second transistor and the fourth transistor are turned on, and the output signal of the nth shift register is transformed into and kept at the low voltage level; and when the output signal of the (n+2)th shift register is at the high voltage level, the seventh transistor is turned on and the second capacitor stores the characteristic voltage.

5. A display, comprising:

a glass substrate comprising a plurality of pixels;

a source driver for driving the pixels; and a gate driver, disposed on the glass substrate, for enabling the pixels, wherein the gate driver has (N+1) shift registers, N is a positive integer, and the nth shift register comprises:

an input unit for receiving an output signal of the (n−1)th shift register of the gate driver;

an output unit, coupled to the input unit, for receiving an Mth clock signal and outputting an output signal of the nth shift register, wherein M is equal to 1 when n is an odd number, and M is equal to 2 when n is an even number;

a first output pull-down unit, coupled to the output unit, for receiving a low operation voltage;

a second output pull-down unit, coupled to the output unit, for receiving the low operation voltage;

a first threshold voltage memory unit, coupled to the input unit and the first output pull-down unit, for receiving a first operation voltage, the low operation voltage, an output signal of the (n+1)th shift register of the gate driver, and an output signal of the (n+2)th shift register of the gate driver; and a second threshold voltage memory unit, coupled to the input unit and the second output pull-down unit, for receiving a second operation voltage, the low operation voltage, the output signal of the (n+1)th shift register and the output signal of the (n+2)th shift register, wherein:

n is a positive integer ranging from 1 to (N+1);

when the output signal of the (n+1)th shift register is at a high voltage level, the first operation voltage is at the high voltage level, the second operation voltage is at low voltage level, and the first threshold voltage memory unit turns on the first output pull-down unit such that the output signal of the nth shift register is transformed into and kept at the low voltage level in an even-numbered frame period; and the first operation voltage is at the low voltage level, the second operation voltage is at the high voltage level, and the second threshold voltage memory unit turns on the second output pull-down unit such that the output signal of the nth shift register is transformed into and maintained at the low voltage level in an odd-numbered frame period; and when the output signal of the (n+2)th shift register is at the high voltage level, the first threshold voltage memory unit stores a first characteristic voltage relating to a threshold voltage of the first output pull-down unit in the even-numbered frame period, and the second threshold voltage memory unit stores a second characteristic voltage relating to a threshold voltage of the second output pull-down unit in the odd-numbered frame period.

6. The display according to claim 5, wherein the input unit comprises:

a first transistor, wherein a control terminal of the first transistor receives the output signal of the (n−1)th shift register of the gate driver, and a first terminal of the first transistor is coupled to the control terminal of the first transistor.

7. The display according to claim 6, wherein the output unit comprises:

a third transistor, wherein a control terminal of the third transistor is coupled to a second terminal of the first transistor, a first terminal of the third transistor receives the Mth clock signal, and a second terminal of the third transistor outputs the output signal of the nth shift register, wherein M is equal to 1 when n is the odd number, and M is equal to 2 when n is the even number; and a first capacitor, wherein a first terminal of the first capacitor is coupled to the control terminal of the third transistor, and a second terminal of the first capacitor is coupled to the second terminal of the third transistor.

8. The display according to claim 7, wherein the first output pull-down unit comprises:

a second transistor, wherein a first terminal of the second transistor is coupled to the second terminal of the first transistor, and a second terminal of the second transistor receives the low operation voltage; and a fourth transistor, wherein a control terminal of the fourth transistor is coupled to a control terminal of the second transistor, a first terminal of the fourth transistor is coupled to the second terminal of the third transistor, and a second terminal of the fourth transistor receives the low operation voltage.

9. The display according to claim 8, wherein the second output pull-down unit comprises:
a fifth transistor, wherein a first terminal of the fifth transistor is coupled to the second terminal of the first transistor, and a second terminal of the fifth transistor receives the low operation voltage; and
a sixth transistor, wherein a control terminal of the sixth transistor is coupled to a control terminal of the fifth transistor, a first terminal of the sixth transistor is coupled to the second terminal of the third transistor, and a second terminal of the sixth transistor receives the low operation voltage.

10. The display according to claim 9, wherein the first threshold voltage memory unit comprises:
a seventh transistor formed on the glass substrate, wherein a control terminal of the seventh transistor is coupled to the first terminal of the first transistor, a first terminal of the seventh transistor is coupled to the control terminal of the second transistor, and a second terminal of the seventh transistor receives the low operation voltage;
a second capacitor, wherein a first terminal of the second capacitor is coupled to the first terminal of the seventh transistor, and a second terminal of the second capacitor is coupled to the second terminal of the seventh transistor;
an eighth transistor formed on the glass substrate, wherein a control terminal of the eighth transistor receives the output signal of the (n+1)th shift register, a first terminal of the eighth transistor receives the first operation voltage, and a second terminal of the eighth transistor is coupled to the first terminal of the seventh transistor;
a ninth transistor formed on the glass substrate, wherein a control terminal of the ninth transistor receives the output signal of the (n+2)th shift register, and a first terminal of the ninth transistor is coupled to the first terminal of the seventh transistor;
a tenth transistor formed on the glass substrate, wherein a control terminal of the tenth transistor is coupled to the first terminal of the seventh transistor, and a first terminal of the tenth transistor is coupled to a second terminal of the ninth transistor; and
an eleventh transistor formed on the glass substrate, wherein a control terminal of the eleventh transistor is coupled to a second terminal of the tenth transistor and a first terminal of the eleventh transistor, and a second terminal of the eleventh transistor receives the low operation voltage.

11. The display according to claim 10, wherein:
in the even-numbered frame period, the first operation voltage is at the high voltage level;
when the output signal of the (n+1)th shift register is at the high voltage level, the eighth transistor is turned on such that the tenth transistor, the second transistor and the fourth transistor are turned on, and the output signal of the nth shift register is transformed into and kept at the low voltage level; and
when the output signal of the (n+2)th shift register is at the high voltage level, the ninth transistor is turned on, and the second capacitor stores the first characteristic voltage.

12. The display according to claim 9, wherein the second threshold voltage memory unit comprises:
a twelfth transistor formed on the glass substrate, wherein a control terminal of the twelfth transistor is coupled to the first terminal of the first transistor, a first terminal of the twelfth transistor is coupled to the control terminal of the fifth transistor, and a second terminal of the twelfth transistor receives the low operation voltage;
a third capacitor, wherein a first terminal of the third capacitor is coupled to the first terminal of the twelfth transistor, and a second terminal of the third capacitor is coupled to the second terminal of the twelfth transistor;
a thirteenth transistor formed on the glass substrate, wherein a control terminal of the thirteenth transistor receives the output signal of the (n+1)th shift register, a first terminal of the thirteenth transistor receives the second operation voltage, and a second terminal of the thirteenth transistor is coupled to the first terminal of the twelfth transistor;
a fourteenth transistor formed on the glass substrate, wherein a control terminal of the fourteenth transistor receives the output signal of the (n+2)th shift register, and a first terminal of the fourteenth transistor is coupled to the first terminal of the twelfth transistor;
a fifteenth transistor formed on the glass substrate, wherein a control terminal of the fifteenth transistor is coupled to the first terminal of the fourteenth transistor, and a first terminal of the fifteenth transistor is coupled to a second terminal of the fourteenth transistor; and
a sixteenth transistor formed on the glass substrate, wherein a control terminal of the sixteenth transistor is coupled to a second terminal of the fifteenth transistor and a first terminal of the sixteenth transistor, and a second terminal of the sixteenth transistor receives the low operation voltage.

13. The display according to claim 12, wherein:
in the odd-numbered frame period, the second operation voltage is at the high voltage level;
when the output signal of the (n+1)th shift register is at the high voltage level, the thirteenth transistor is turned on such that the fifteenth transistor, the fifth transistor and the sixth transistor are turned on, and the output signal of the nth shift register is transformed into and kept at the low voltage level; and
when the output signal of the (n+2)th shift register is at the high voltage level, the fourteenth transistor is turned on, and the third capacitor stores the second characteristic voltage.

14. The display according to claim 5, wherein the nth shift register further comprises:
a seventeenth transistor formed on the glass substrate, wherein a control terminal of the seventeenth transistor receives the output signal of the (n+1)th shift register, a first terminal of the seventeenth transistor is coupled to a second terminal of the first transistor, and a second terminal of the seventeenth transistor receives the low operation voltage; and
an eighteenth transistor formed on the glass substrate, wherein a control terminal of the eighteenth transistor receives the output signal of the (n+1)th shift register, a first terminal of the eighteenth transistor is coupled to a second terminal of the third transistor, and a second terminal of the eighteenth transistor receives the low operation voltage.

15. A display, comprising:
a glass substrate comprising a plurality of pixels;
a source driver for driving the pixels; and a gate driver, disposed on the glass substrate, for enabling the pixels, wherein the gate driver has (N+1) shift registers, N is a positive integer, and the nth shift register comprises:
   an input unit for receiving an output signal of the (n−1)th shift register of the gate driver, the input unit including:
      a first transistor, wherein a control terminal of the first transistor receives the output signal of the (n−1)th shift register of the gate driver, and a first terminal of the first transistor is coupled to the control terminal of the first transistor;
   an output unit, coupled to the input unit, for receiving an Mth clock signal and outputting an output signal of the nth shift register, wherein M is equal to 1 when n is an odd number, and M is equal to 2 when n is an even number, and the output unit includes:
      a third transistor, wherein a control terminal of the third transistor is coupled to a second terminal of the first transistor, a first terminal of the third transistor receives the Mth clock signal, and a second terminal of the third transistor outputs the output signal of the nth shift register, wherein M is equal to 1 when n is the odd number, and M is equal to 2 when n is the even number; and
      a first capacitor, wherein a first terminal of the first capacitor is coupled to the control terminal of the third transistor, and a second terminal of the first capacitor is coupled to the second terminal of the third transistor;
   an output pull-down unit, coupled to the output unit, for receiving a low operation voltage, the output pull-down unit including:
      a ninth transistor formed on the glass substrate, wherein a control terminal of the ninth transistor receives the output signal of the (n+1)th shift register, a first terminal of the ninth transistor is coupled to the second terminal of the first transistor, and a second terminal of the ninth transistor receives the low operation voltage; and
      a tenth transistor formed on the glass substrate, wherein a control terminal of the tenth transistor receives the output signal of the (n+1)th shift register, a first terminal of the tenth transistor is coupled to the second terminal of the third transistor, and a second terminal of the tenth transistor receives the low operation voltage; and
   a threshold voltage memory unit, coupled to the input unit and the output pull-down unit, for receiving the low operation voltage and an output signal of the (n+1)th shift register of the gate driver, wherein:
n is a positive integer ranging from 1 to (N+1); and
when the output signal of the (n+1)th shift register is at a high voltage level, the threshold voltage memory unit turns on the output pull-down unit such that the output signal of the nth shift register is transformed into and maintained at a low voltage level, and the threshold voltage memory unit stores a characteristic voltage relating to a threshold voltage of the output pull-down unit.

16. A display, comprising:
a glass substrate comprising a plurality of pixels;
a source driver for driving the pixels; and
a gate driver, disposed on the glass substrate, for enabling the pixels, wherein the gate driver has (N+1) shift registers, N is a positive integer, and the nth shift register comprises:
   an input unit for receiving an output signal of the (n−1)th shift register of the gate driver, the input unit including:
      a first transistor, wherein a control terminal of the first transistor receives the output signal of the (n−1)th shift register of the gate driver, and a first terminal of the first transistor is coupled to the control terminal of the first transistor;
   an output unit, coupled to the input unit, for receiving an Mth clock signal and outputting an output signal of the nth shift register, wherein M is equal to 1 when n is an odd number, and M is equal to 2 when n is an even number, and the output unit includes:
      a third transistor, wherein a control terminal of the third transistor is coupled to a second terminal of the first transistor, a first terminal of the third transistor receives the Mth clock signal, and a second terminal of the third transistor outputs the output signal of the nth shift register, wherein M is equal to 1 when n is the odd number, and M is equal to 2 when n is the even number; and
      a first capacitor, wherein a first terminal of the first capacitor is coupled to the control terminal of the third transistor, and a second terminal of the first capacitor is coupled to the second terminal of the third transistor;
   an output pull-down unit, coupled to the output unit, for receiving a low operation voltage, the output pull-down unit including:
      a tenth transistor formed on the glass substrate, wherein a control terminal of the tenth transistor receives the output signal of the (n+1)th shift register, a first terminal of the tenth transistor is coupled to the second terminal of the first transistor, and a second terminal of the tenth transistor receives the low operation voltage; and
      an eleventh transistor formed on the glass substrate, wherein a control terminal of the eleventh transistor receives the output signal of the (n+1)th shift register, a first terminal of the eleventh transistor is coupled to the second terminal of the third transistor, and a second terminal of the eleventh transistor receives the low operation voltage; and
   a threshold voltage memory unit, coupled to the input unit and the output pull-down unit, for receiving the low operation voltage, an output signal of the (n+1)th shift register of the gate driver, and an output signal of the (n+2)th shift register of the gate driver, wherein:
n is a positive integer ranging from 1 to (N+1);
when the output signal of the (n+1)th shift register is at a high voltage level, the threshold voltage memory unit turns on the output pull-down unit such that the output signal of the nth shift register is transformed into and maintained at a low voltage level; and
when the output signal of the (n+2)th shift register is at the high voltage level, the threshold voltage memory unit stores a characteristic voltage relating to a threshold voltage of the output pull-down unit.

\* \* \* \* \*